United States Patent
Zhou

(10) Patent No.: US 9,275,919 B2
(45) Date of Patent: Mar. 1, 2016

(54) TEST MODULE DEVICE AND A TEST METHOD FOR MONITORING THE STABILITY OF PROCESSES

(71) Applicant: Shanghai Huali Microelectronics Corporation, Shanghai (CN)

(72) Inventor: YuYu Zhou, Shanghai (CN)

(73) Assignee: Shanghai Huali Microelectronics Corporation, Shanghai (CN)

( * ) Notice: Subject to any disclaimer, the term of this patent is extended or adjusted under 35 U.S.C. 154(b) by 165 days.

(21) Appl. No.: 14/080,534

(22) Filed: Nov. 14, 2013

(65) Prior Publication Data
US 2014/0333325 A1  Nov. 13, 2014

(30) Foreign Application Priority Data
May 7, 2013  (CN) .......................... 2013 1 0165992

(51) Int. Cl.
*H01H 31/12* (2006.01)
*H01L 21/66* (2006.01)

(52) U.S. Cl.
CPC ......... *H01L 22/34* (2013.01); *H01L 2924/0002* (2013.01)

(58) Field of Classification Search
CPC ... H01L 22/34; G03F 7/70633; G03F 9/7003; G01N 2223/611; G01N 2223/6113; H01J 2237/24592
USPC .............. 324/551, 762.01, 762.05, 719, 71.5; 438/17, 18
See application file for complete search history.

(56) References Cited

U.S. PATENT DOCUMENTS

| | | | | |
|---|---|---|---|---|
| 6,610,448 | B2 * | 8/2003 | Sato | G03F 7/70633 430/22 |
| 6,982,793 | B1 * | 1/2006 | Yang | G03F 9/7076 356/401 |
| 7,230,704 | B2 * | 6/2007 | Sezginer | G03F 7/70633 356/401 |
| 7,425,396 | B2 * | 9/2008 | Gruss | G03F 7/70633 257/E23.179 |
| 7,483,156 | B2 * | 1/2009 | Cho | G03F 7/70633 356/635 |
| 7,599,063 | B2 * | 10/2009 | Yang | G03F 7/70633 356/401 |
| 7,645,620 | B2 * | 1/2010 | Martin | H01L 22/12 257/48 |
| 7,700,946 | B2 * | 4/2010 | Martin | H01L 22/12 257/48 |
| 7,804,994 | B2 * | 9/2010 | Adel | G03F 7/705 356/399 |

(Continued)

FOREIGN PATENT DOCUMENTS

CN  101266937 A  9/2008
CN  101266937 A *  9/2008

(Continued)

*Primary Examiner* — Jermele M Hollington
*Assistant Examiner* — Sean Curtis
(74) *Attorney, Agent, or Firm* — Timothy T. Wang; Ni, Wang & Massand, PLLC

(57) ABSTRACT

The present invention discloses a test method for monitoring the stability of process and a test module device thereof. The test module device comprises: a substrate, a certain number of the first metal wires, a certain number of the second metal wires, an insulating block is disposed between the adjacent first metal wires. The method comprises: a preconfigured value of the test current in the test module is provided in the process; the multiple test module devices are provided. The present invention adopts a method adopting an offset to set the upper metal wire and lower metal wire in the test module instead of regular equal interval setting. Consequently, the safety zone of the overlay in the process can be determined. The present invention can monitor the stability of the process.

12 Claims, 4 Drawing Sheets

(56) References Cited

U.S. PATENT DOCUMENTS

| | | | | |
|---|---|---|---|---|
| 7,858,404 B2 * | 12/2010 | Huang | | G03F 7/70633 356/399 |
| 8,179,536 B2 | 5/2012 | Huang | | G03F 7/70633 356/614 |
| 2004/0229471 A1 * | 11/2004 | Abdulhalim | | G03F 7/70633 438/736 |
| 2004/0257571 A1 * | 12/2004 | Mieher | | G01N 21/956 356/401 |
| 2005/0018190 A1 * | 1/2005 | Sezginer | | G03F 7/70633 356/401 |
| 2005/0072945 A1 * | 4/2005 | Fukazawa | | G01N 21/956 250/559.45 |
| 2005/0105092 A1 * | 5/2005 | Ausschnitt | | G06F 7/70633 356/401 |
| 2005/0195398 A1 * | 9/2005 | Adel | | B82Y 10/00 356/401 |
| 2006/0138411 A1 * | 6/2006 | Lachenmann | | H01L 22/34 257/48 |
| 2013/0032712 A1 * | 2/2013 | Shih | | G01N 23/04 250/307 |
| 2013/0256902 A1 * | 10/2013 | Lu | | H01L 23/5226 257/774 |
| 2014/0320627 A1 * | 10/2014 | Miyamoto | | G03F 7/70633 348/80 |
| 2014/0333325 A1 * | 11/2014 | Zhou | | 324/551 |
| 2015/0136976 A1 * | 5/2015 | Matsuoka | | H01J 37/222 250/306 |

FOREIGN PATENT DOCUMENTS

| | | | | | |
|---|---|---|---|---|---|
| CN | 100576526 C | * | 12/2009 | | |
| CN | 100576526 C | | 12/2009 | | |
| CN | 102412232 A | * | 4/2012 | | |
| DE | WO 2013110664 A1 | * | 8/2013 | | G03F 9/7046 |
| KR | 20070069852 A | * | 7/2007 | | |
| KR | 20090098278 A | * | 9/2009 | | |
| WO | WO 2013110664 A1 | * | 8/2013 | | |

* cited by examiner

TEST MODULE DEVICE AND A TEST METHOD FOR MONITORING THE STABILITY OF PROCESSES

CROSS-REFERENCE TO RELATED APPLICATIONS

The present application claims priority under the Paris Convention to Chinese application number CN 201310165992.9, filed on May 7, 2013, the disclosure of which is herewith incorporated by reference in its entirety.

FIELD OF THE INVENTION

The present invention relates to a test module and a test method which is in a semiconductor electrical test, especially relates to a test module and a testing method which is applied to monitor the stability of the process.

BACKGROUND OF THE INVENTION

During the semiconductor manufacturing process, particularly in large scale manufacturing process, the short of the semiconductor device incurs frequently due to the overlay deviation between the metal and the contact holes. Consequently, it causes the instability of the semiconductor device yield. The overlay safety zone assessments are required in order to monitor the process stability.

In the prior art, there is no good method for assessing the overlay safety zone during the production of semiconductor. The remedy measures are taken until the problem occurs, which would resulted in the passive effect of controlling the stability of the process. Hence, the quality of the product is affected in the production process.

Chinese patent (CN 100576526C) discloses a circuit structure to realize interconnection of the upper and lower metal, which comprises the upper metal and the lower metal mounted in the contact hole between the upper metal and the lower metal. The said upper metal and lower metal are aligned strictly with each other. The contact hole denominated in line forms an offset of different aperture from 0 to 0.5 with the lower metal and offset value and offset direction between two adjacent lines of contact holes are different. When the contact holes of the left most line offset to left with the value from 0 to 0.5, the left side of the adjacent line offset to right with the value from 0 to 0.5. The invention can timely detect and identify the offset between the contact hole and the lower metal as well as the titanium lacking in the process, which is applicable to process development of the semiconductor integrated circuit. The patent can detect and confirm the offset and titanium deletion process issues in the through hole and the lower metal, but it did not solve the problem of determining the safety zone of the overlay before the production of the semiconductor is ensured.

Chinese patent (CN 101266937A) discloses a method for testing the overlay offset of semiconductor process. It comprises forming an overlay offset measurement target, which includes a first feature on a first layer and a second feature on a second layer. The first feature and the second feature have the first preconfigured overlay offset. The target is irradiated. The reflectivity of the irradiated target is determined. An overlay offset for the first layer and the second layer is calculated using the determined reflectivity. The patent calculates the preconfigured overlay offset of the first layer and the second layer by using the reflectivity. It only disclosed a method of measuring an overlay offset without solving the problem of determining the safety zone of the overlay before the production of the semiconductor is ensured.

Hence, the safety zone of the overlay is not determined before the production of the semiconductor is ensured currently.

SUMMARY OF THE INVENTION

Due to the defects of the traditional art, the present invention discloses a test module device and methods for monitoring the stability of processes a process control system and method for stability testing module.

A test module device applied to monitor the stability of the process, wherein it comprising: a substrate which is provided with a first test layer and a second test layer. The upper surface of the substrate is covered over with the first test layer, and the upper surface of the first layer is covered over with the second test layer.

According to the above device, wherein the first test layer comprises a certain number of the first metal wires and an insulating block is provided between the two adjacent first metal wires.

According to the above device, wherein the second test layer comprises a certain number of the second metal wires, and each of the second metal wires are located in the upper surface of the insulating block. The second metal wires are not connected to the first metal wires.

According to the above device, wherein the distances between each of the second metal wires and the two first metal wires adjacent to the second metal wires are not equal.

According to the above device, wherein the first layer further comprises a first metal connecting wires, the first metal wires are connected each other through the first connecting metal wires; the second test layer further comprises a second metal connecting wire, the second metal wires are connected each other through the second metal connecting wires.

According to the above device, wherein the first metal wires are rectangular structure and each of the second metal wires is rectangular structure.

According to the above device, wherein a certain number of the first metal wires are parallel to each other; a certain number of the second metal wires are parallel to each other.

According to the above device, wherein a certain number of the first metal wires are parallel to the second metal wires.

According to the above device, wherein each of the second metal wires is provided with multiple contact holes.

According to the above device, wherein there is a certain number of the contact holes, and the contact holes located in the same second metal wires are distributed on the second metal wires at equal intervals in turn.

A method of monitoring the stability of the process, wherein the test module described above is applied to monitor the stability of the process; the method comprises the following steps, a preconfigured value of the test current in the test module is provided in the process;

a certain number of the test module devices are provided, wherein, there is an offset value between each first metal wires of the test module and each second metal wires of the test module, and the offset of each of the test module device are not equal;

the value of the test current of each test module device is obtained;

the safety zone of the overlay of the process is obtained after each value of the test current and the preconfigured value were compared.

According to the above method, wherein the comparison comprises:

In the value of the test current of each test module, the test module is selected, whose current is smaller than and closest to preconfigured value.

The offset of the test module is configured as the maximum value of the safety zone of overlay of the process.

According to the above method, wherein the preconfigured value is a reference value which is defined based on specific process requirements.

According to the above method, wherein the value of the current obtained in the test, including those bigger than the preconfigured value of the test current and those smaller than the preconfigured value of the test current.

According to the above method, wherein in each of the test module, there is an intermediate position between each two adjacent first metal wires. The intermediate position is at the position which located in the middle of the distance between the two first metal wires.

According to the above method, the distances between the location of the second metal wires and the location of the intermediate position constitute the offset.

The advantageous effects of the above technical solution are as follows: The present invention adopts a method adopting an offset to set the upper metal wire and lower metal wire in the test module instead of regular equal interval setting. Consequently, the safety zone of the overlay in the process can be determined. The present invention can monitor the stability of the process.

DETAILED DESCRIPTION OF THE PREFERRED EMBODIMENT

The present invention will be further illustrated in combination with the following Figures and embodiments, but it should not be deemed as limitation of the present invention.

The invention provides a test module and a method for monitoring the stability of the process. The present invention can be used for the process whose technical node is less than 22 nm, 32/28 nm, 45/40 nm, 65/55 nm, 90 nm and 130 nm. The present invention is applied to the test platform.

The test module for monitoring the process stability in this invention is used for ensuring the deviation allowed of the overlay between the metal and through holes in order that the short circuit will not occur.

Figure 1:
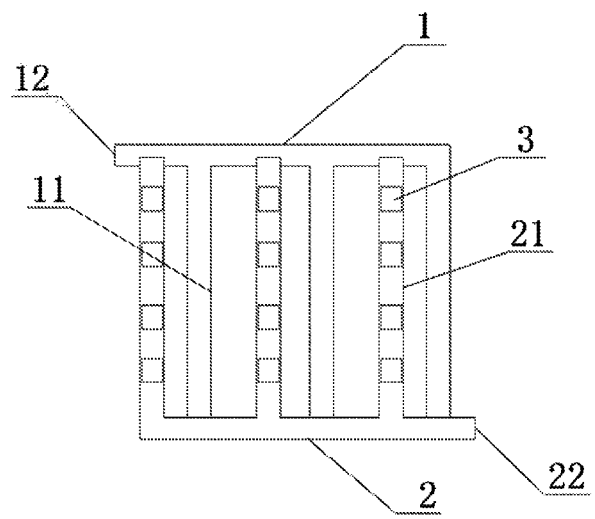
FIG. 1 is a top view of the test module structure.
Figure 2A:
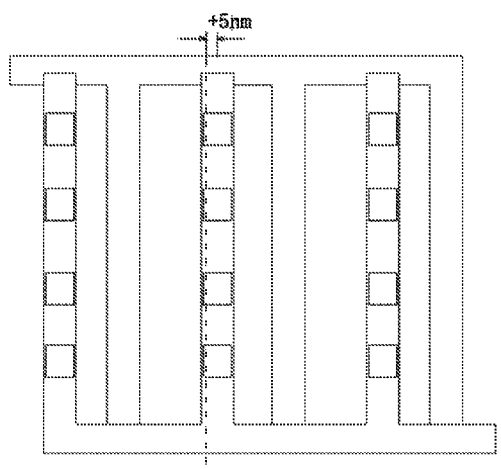
FIG. 2A is a top view of the test module structure whose offset is +5 nm.
Figure 2B:
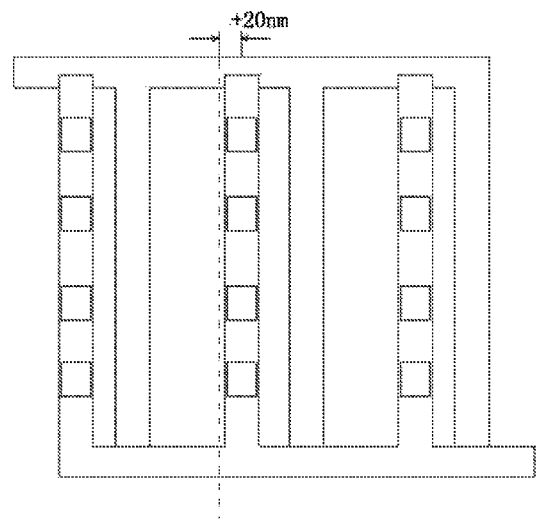
FIG. 2B a top view of the test module structure whose offset is −80 nm.
Figure 2C:
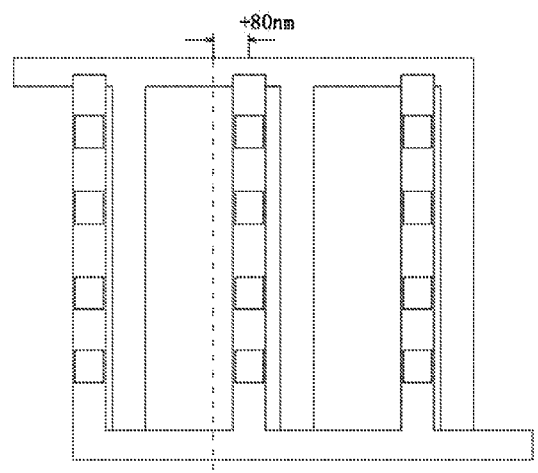
FIG. 2C a top view of the test module structure whose offset is +20 nm.
Figure 2D:
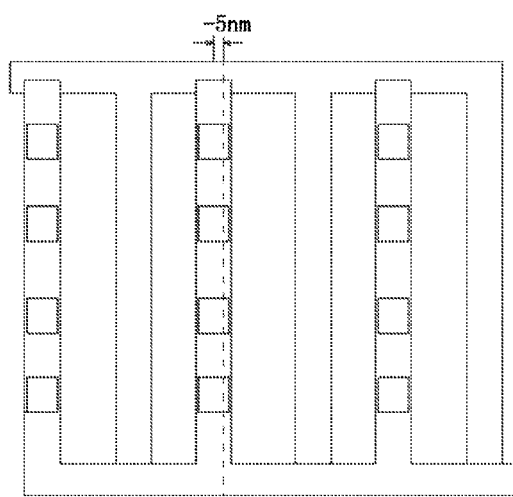
FIG. 2D a top view of the test module structure whose offset is +80 nm.
Figure 2E:
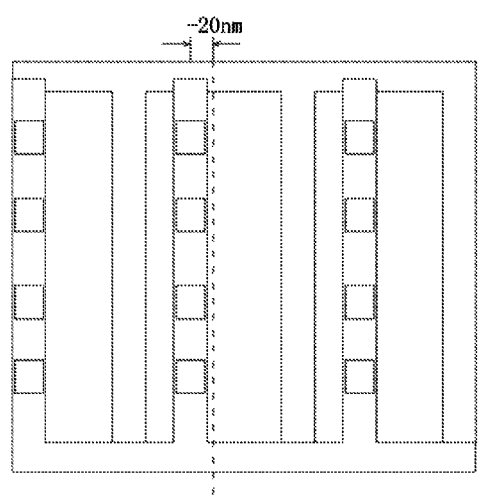
FIG. 2E is the embodiment of the present invention, a top view of the test module structure whose offset is −50 nm.
Figure 2F:
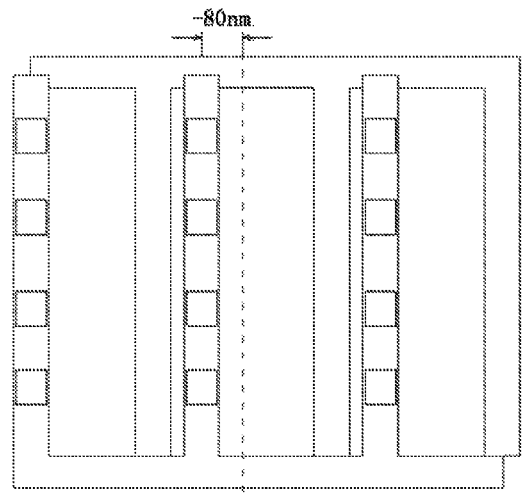
FIG. 2F a top view of the test module structure are whose offset is −20 nm.

FIG. 1 is a top view of test module in the embodiment of the invention. As shown in FIG. 1, the test module includes a substrate (not shown in the Figure), a First Test Layer 1 and a Second Test Layer 2 wherein the first test layer covering the upper surface of the substrate and the second layer covering the upper surface of the first layer. Second Test Layer 2 comprises a certain number of Second Metal Wires 21. First Test Layer 1 comprises a certain number of First Metal Wires 11. First Metal Wires 11 are connected each other through First Connecting Metal Wires 12. Second Metal Wires 21 are connected to each other through Second Metal Connecting Wires 22, providing an insulating block between two adjacent First Metal Wires 11 (not shown in the Figure). Second Metal Wires 21 are located in the upper surface of the insulating block. The distance between each of Second Metal Wires 21 is equal, and the distance between each of First Metal Wires 11 is equal. Second Metal Wires 21 and First Metal Wires 11 are deployed in a cross distribution, i.e., Second Metal Wires 21 and First Metal Wires 11 is located in a different vertical plane. As shown in FIG. 1, Second Metal Wires 21 and First Metal Wires 11 are not overlapped each other. Second Metal Wires 21 are not located in the middle position of two adjacent first metal wires 11, but in the middle position which towards the left or the right for a certain distance. A contact hole 3 is set on each of the second metal wires.

Further, First Metal Wires 11 are rectangular structure and are parallel to each other. Second Metal Wires 21 are rectangular structure and are parallel to each other. First Metal Wires 11 are parallel to Second Metal Wires 21.

For the convenience of description in the present embodiment, the middle position is provided as the zero point, the left side as a negative value, and the right side as a positive value. FIGS. 2A-2F are the structure schematic view of the embodiments of the present invention, which depicts the test module device that are at different offsets. In the test module illustrated in FIG. 2A, the second metal wires is located at the +5 nm position, which indicates that the second metal wires is located in the position which has a offset in right for 5 nm of the middle position of the two adjacent first metal. Likewise, in the test module illustrated in FIG. 2B, the second metal wires is located in the position which has a offset in right for 20 nm of the middle position of the two adjacent first metal. In the test module illustrated in FIG. 2C, the second metal wires is located in the position which has a offset in right for 80 nm of the middle position of the two adjacent first metal. In the test module illustrated in FIG. 2D, the second metal wires is located in the position which has a offset in left for 5 nm of the middle position of the two adjacent first metal. In the test module illustrated in FIG. 2E, the second metal wires is located in the position which has a offset in left for 20 nm of the middle position of the two adjacent first metal. In the test module illustrated in FIG. 2F, the second metal wires is located in the position which has a offset in left for 80 nm of the middle position of the two adjacent first metal. The said test module device structure design breaks the original design specifications. There is an offset between the first metal wires and the second metal wires which are in the test module. By the current value of the test module device which is in the different offset position, it is available to define the safety zone of the overlap deviation of the relative process. In large scale manufacturing process, the short circuit will not occur in the manufactured device which is in the safety zone of the overlap deviation.

Figure 3:
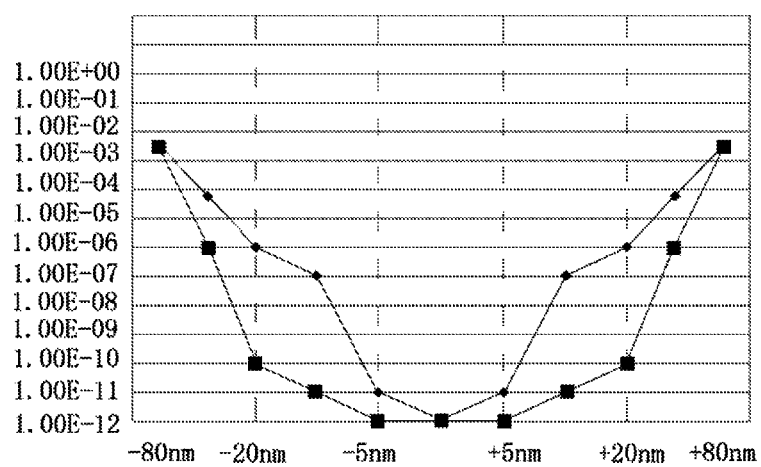
FIG. 3 is a test data diagram of the test module structure.

In the semiconductor device manufacturing process, each process will have a request for each current. Determining a current default before the process starts. The current value is defined based on the process requirements. The current value is normal when it is in the default range, and the current value is abnormal when it is out of the default range, i.e., when the current value is less than the default value, the current value is safe, when the current value is more than the default value, the current value is unsafe. Assuming the safety current of the process is ranged form $1.00*10-10$ A when it is in the normal yield. FIG. 3 is a schematic diagram of the test data of the test module in the embodiment of the invention. As shown in FIG. 3, the ordinate in the Figure represents the value of the current test module, and the abscissa represents the offset of the test module device. The data is added up by testing the current value of the test module based on the different offset values so as to illustrate a line chart as shown in FIG. 3. It can be known from the line chart that when the offset value of the test module is ranged from −20 nm to +20 nm, the measured current values of the test module are less than the current default $1.00*10-10$ A. The test current of the test module which is lower than the offset value is conformed with the default value. Simultaneously it is known from the FIG. 3 that when the offset value of the test module is ranged from −20 nm to +20 nm, the measured current value of the test module is $1.00*10-11$ A. It can be ensured that the safety zone of the overlay offset value is [−20, +20] in the process. When the process is abnormal, the current default is changed correspondingly. As shown in the figure, the current default of the process which is abnormal is $1.00*10-11$ A in the embodiment, and the safety zone of the overlay offset value in the process has been changed. It is known from the figure that when the offset value of the test module is ranged from −5 nm to +5 nm, the current value tested by the test module is $1.00*10-11$ A, i.e., the default value of the process. Meanwhile, when the offset value of the test module is ranged from −5 nm to +5 nm, the range of the tested current happens to be $1.00*10-11$ A. When the offset value of the test module is out of the range of −5 nm to +5 nm, the tested current value is greater than $1.00*10-11$ A. It can be ensured that the safety zone of the overlay offset value is [−5, +5]. It is proved that the range of the safety zone in normal condition is larger than the range of the safety zone in abnormal condition.

It can ensure that the connection between upper metal and the lower metal is open where the short connection will not occur. The stability of the device can be monitored. It also can be provided with a spec for the safety zone. Consequently, there will be a buffer zone in the safety zone. Besides, it also can be provided with an alarm system that when the actual situation does not meet the safety zone and buffer zone between the settings, it may issue a warning to alert technical staff makes appropriate and timely response.

Although a typical embodiment of a particular structure of the specific implementation way has been given with the above description and the figures, it is appreciated that other changes based on the spirit of this invention may also be made. Though the preferred embodiments are proposed above, these contents will never be the limitation of this invention.

It is obvious for the skilled in the art to make varieties of changes and modifications after reading the above descriptions. Hence, the Claims attached should be regarded as all the changes and modifications which cover the real intention and the range of this invention. Any and all equivalent contents and ranges in the range of the Claims should be regarded belonging to the intention and the range of this invention.

The invention claimed is:

1. A test module device applied to monitor the stability of a semiconductor manufacturing process, wherein it comprises a first test layer and a second test layer;
   a upper surface of the first test layer is covered over with the second test layer;
   the first test layer comprises a plurality of a first metal wires;
   the second test layer comprises a plurality of a second metal wires; the second metal wires are not connected to the first metal wires;
   the distances between each of the second metal wires and the two first metal wires adjacent to the second metal wires are not equal;
   there is an offset value between each first metal wires of the test module and each second metal wires of the test module, wherein the second metal wire is not located in the middle position of two adjacent first metal wires;
   the value of a test current of each test modules device is compared with a preconfigured value of the test current in the test module to obtain a safety zone of an overlay between the first or the second metal wires and contact holes during the semiconductor manufacturing process.

2. The test module according to claim 1, wherein the first test layer further comprises a first metal connecting wires, the first metal wires are connected each other through the first connecting metal wires; the second test layer further comprises a second metal connecting wire, the second metal wires are connected each other through the second metal connecting wires.

3. The test module according to claim 1, wherein each of the first metal wires are rectangular structure and each of the second metal wires are rectangular structure.

4. The test module according to claim 1, wherein a plurality of the first metal wires are parallel to each other; a plurality of the second metal wires are parallel to each other.

5. The test module according to claim 4, where a plurality of the first metal wires are parallel to the second metal wires.

6. The test module according to claim 1, wherein each of the second metal wires are provided with multiple contact holes.

7. The test module according to claim 6, wherein there is a plurality of the contact holes, and the contact holes located in the same second metal wires are distributed on the second metal wires at equal intervals in turn.

8. A method of monitoring the stability of the semiconductor manufacturing process, wherein the test module which is described in claim 1 is applied to monitor the stability of the semiconductor manufacturing process, the method comprises:
   STEP 1: providing the preconfigured value of the test current in the test module in the semiconductor manufacturing process;
   STEP 2: providing a plurality of the test module devices, wherein, there is an offset value between each first metal wires of the test module and each second metal wires of the test module, and the offset of each of the test module device are not equal;
   STEP 3: testing the value of the test current of each test modules device;
   STEP 4: determining the safety zone of the overlay of the semiconductor manufacturing process after each value of the test current and the preconfigured value were compared.

9. The method according to claim 8, wherein the comparison of each value of the test current and the preconfigured value comprises:
   in the value of the test current of each test module, the test module is selected, whose current is smaller than and closest to preconfigured value,
   the offset of the test module is configured to the maximum value of the safety zone of overlay of the semiconductor manufacturing process.

10. The method according to claim 8, wherein the preconfigured value is a reference value which is defined based on specific process requirements.

11. The method according to claim 8, wherein the value of the current obtained in the test, including the value bigger than the preconfigured value of the test current and the value smaller than the preconfigured value of the test current.

12. The method according to claim 8, wherein in each of the test module, there is an intermediate position between each two adjacent first metal wires, the intermediate position is a the position which located in the middle of the distance between the two first metal wires;

the distances between the location of the second metal wires and the location of the intermediate position constitute the offset.

* * * * *